United States Patent
Frounchi et al.

(10) Patent No.: US 10,979,038 B2
(45) Date of Patent: Apr. 13, 2021

(54) METHODS AND DEVICES FOR IN-PHASE AND QUADRATURE SIGNAL GENERATION

(71) Applicant: Georgia Tech Research Corporation, Atlanta, GA (US)

(72) Inventors: Milad Frounchi, Atlanta, GA (US); John D. Cressler, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 16/546,847

(22) Filed: Aug. 21, 2019

(65) Prior Publication Data
US 2020/0067497 A1 Feb. 27, 2020

Related U.S. Application Data

(60) Provisional application No. 62/720,751, filed on Aug. 21, 2018.

(51) Int. Cl.
| | |
|---|---|
| *H03K 5/13* | (2014.01) |
| *H03H 7/21* | (2006.01) |
| *H03H 7/06* | (2006.01) |
| *H03K 5/00* | (2006.01) |

(52) U.S. Cl.
CPC .......... *H03K 5/13* (2013.01); *H03H 7/06* (2013.01); *H03H 7/21* (2013.01); *H03K 2005/00286* (2013.01)

(58) Field of Classification Search
CPC .......... H03K 5/13; H03K 5/131; H03K 5/133; H03K 5/134; H03K 5/135; H03K 5/14; H03K 5/145; H03K 2005/00286; H03H 7/01; H03H 7/06; H03H 7/18; H03H 7/185; H03H 7/19; H03H 7/20; H03H 7/21

See application file for complete search history.

(56) References Cited

U.S. PATENT DOCUMENTS

| | | | |
|---|---|---|---|
| 7,982,527 B2 * | 7/2011 | Dawe | H03D 7/14 327/350 |
| 2008/0132189 A1 * | 6/2008 | Maxim | H04B 1/28 455/280 |
| 2011/0092169 A1 * | 4/2011 | Savoj | H03H 7/21 455/73 |
| 2013/0076438 A1 * | 3/2013 | Marozsak | H03F 3/45659 330/257 |
| 2017/0201019 A1 * | 7/2017 | Trotta | H01Q 3/267 |

* cited by examiner

*Primary Examiner* — Diana J. Cheng
(74) *Attorney, Agent, or Firm* — Troutman Pepper Hamilton Sanders LLP; Ryan A. Schneider

(57) ABSTRACT

A method for in-phase (I) and quadrature (Q) signal generation is disclosed. The method may include a first stage receiving a differential input signal. The first stage may also generate first differential in-phase and quadrature output signals, which may be sent by the first stage to a second stage. The second stage may generate second differential in-phase and quadrature output signals, which may have amplitude and phase mismatches less than an amplitude and phase mismatches of the first differential output signals. The second stage may then output the second differential I/Q output signals.

24 Claims, 13 Drawing Sheets

METHODS AND DEVICES FOR IN-PHASE AND QUADRATURE SIGNAL GENERATION

CROSS-REFERENCE TO RELATED APPLICATION

This application claims the benefit of, and priority under 35 U.S.C. § 119(e) to, U.S. Provisional Patent Application No. 62/720,851, entitled "A Low-Loss Broadband Quadrature Signal Generation Technique with Symmetric Layout for Millimeter-Wave applications," filed Aug. 21, 2018, the contents of which are hereby incorporated by reference herein in their entirety as if fully set forth below.

FIELD OF THE INVENTION

The presently disclosed subject matter relates generally to methods and devices for in-phase and quadrature signal generation and, more particularly, to methods and devices for generating in-phase and quadrature signals having reduced amplitude and phase mismatches.

BACKGROUND

In the last few decades, radio frequency (RF) and millimeter-wave (mm-wave) systems have become popular for imaging, radiometry, automotive radar, and recently for fifth-generation (5G) cellular communications. In these systems, highly balanced in-phase (I) and quadrature (Q) local oscillator (LO) signal generation plays a key role for achieving high data rates and high image rejection ratios (IRRs). FQ signals, also called quadrature signals, are conventionally generated with resistor-capacitor polyphase filters (PPFs), which are lossy, narrowband, and sensitive to process variations. To improve the phase and amplitude matching, PPFs should be cascaded, but this approach may be less attractive at mm-wave frequencies due to the increased insertion loss. Similarly, highly-coupled transformer-based networks can be cascaded to generate low-loss and wideband quadrature signals, but the self-resonance frequency of these transformers are usually in the lower-end of mm-wave frequency range and these transformers cannot be used for high-frequency systems.

Furthermore, as networks continue to require even higher data rates (multi-Gb/s) for next generation mobile communications, highly accurate in-phase and quadrature (I/Q) signals are needed at mm-wave frequencies. Accordingly, there is a need for improved methods and devices for generating highly accurate I/Q signals.

SUMMARY

Aspects of the disclosed technology include methods and devices for in-phase (I) and quadrature (Q) signal generation. Consistent with the disclosed embodiments, the methods can include a first stage (e.g., two coupled-line couplers) and a second stage (e.g., four coupled-line couplers or a resistor-capacitor polyphase filter). One exemplary method may include receiving a differential input signal at a first stage. The first stage may generate first differential in-phase and quadrature (I/Q) output signals, which may be based on the differential input signal. The method may further include the first stage sending the first differential I/Q output signals to the second stage. In response, the second stage may generate second differential I/Q output signals, which may be based on the first differential I/Q output signals. The amplitude and phase mismatches of the second differential I/Q output signals may be less than the amplitude and phase mismatches of the first differential I/Q output signals.

In some embodiments, the second stage may comprise four coupled-line couplers. The isolation port of these coupled-line couplers may be terminated in matched impedances.

In some embodiments, the second stage may comprise a resistor-capacitor (RC) polyphase filter.

In some embodiments, the differential input signal may include a first input signal and a second input signal.

According to some embodiments, the second input signal may have a phase shift of 180 degrees relative to the first input signal.

In some embodiments, the first stage may include a first input configured to receive the first input signal, and a second input configured to the receive the second input signal.

In some embodiments, the first differential I/Q output signals may include a first output signal, a second output signal, a third output signal, and a fourth output signal. Further, the second output signal may have a phase shift of ninety degrees relative to the first output signal. Similarly, the fourth output signal may have a phase shift of ninety degrees relative to the third output signal.

According to some embodiments, the first stage may include a first output configured to send the first output signal, a second output configured to send the second output signal, a third output configured to send the third output signal, and a fourth output configured to send the fourth output signal.

An exemplary I/Q signal generation system may include a first stage and a second stage. The first stage may comprise two coupled-line couplers. The two coupled-line couplers may receive a differential input signal and generate first differential I/Q output signals, which may be based on the differential input signal. The second stage may comprise a resistor-capacitor polyphase filter or four coupled-line couplers. The coupled-line couplers may include isolation ports that may be terminated in matched impedances. The second stage may be configured to receive the first differential I/Q output signals and generate second differential I/Q output signals. Furthermore, amplitude and phase mismatches of the second differential I/Q output signals may be less than amplitude and phase mismatches of the first differential I/Q output signals.

In some embodiments, the differential input signal may include a first input signal and a second input signal. The second input signal may have a phase shift of one hundred eighty degrees relative to the first input signal.

In some embodiments, the first stage may include a first input configured to receive the first input signal. According to some embodiments, the first stage may further include a second input configured to receive the second input signal.

In some embodiments, the first differential I/Q output signals may include a first output signal, a second output signal, a third output signal, and a fourth output signal. The second output signal may have a phase shift of ninety degrees relative to the first output signal. The third output signal may have a phase shift of ninety degrees relative to the second output signal. The fourth output signal may have a phase shift of ninety degrees relative to the third output signal.

In some embodiments, the first stage may include a first output configured to send the first output signal, a second output configured to send the second output signal, a third output configured to send the third output signal, and a fourth output configured to send the fourth output signal.

According to some embodiments, the first, second, third, and fourth output signals may have equal amplitudes and frequencies.

In some embodiments, the second stage may include a first coupled-line coupler, a second coupled-line coupler, a third coupled-line coupler, and a fourth coupled-line coupler. The isolation ports of the first, second, third, and fourth coupled-line couplers may be terminated in matched impedances.

In some embodiments, the coupled port of the second coupled-line coupler may be connected to a through port of the first coupled-line coupler.

In some embodiments, the coupled port of the third coupled-line coupler may be connected to the through port of the second coupled-line coupler.

In some embodiments, the coupled port of the fourth coupled-line coupler may be connected to the through port of the third coupled-line coupler.

In some embodiments, the coupled port of the first coupled-line coupler may be connected to the through port of the fourth coupled-line coupler.

In some embodiments, the quadrature signal generation system may have a symmetrical layout.

In some embodiments, the quadrature signal generation system may provide for an image rejection ratio of between 29 and 50 dB across a frequency range of 42-102 GHz.

According to some embodiments, the I/Q signal generation system may be connected to a plurality of transistors. The plurality of transistors may have a symmetrical common-centroid layout. Further, each of the plurality of transistors may have a plurality of interconnects that may have about the same length.

Further features of the disclosed design, and the advantages offered thereby, are explained in greater detail hereinafter with reference to specific embodiments illustrated in the accompanying drawings, wherein like elements are indicated be like reference designators.

BRIEF DESCRIPTION OF THE DRAWINGS

Reference will now be made to the accompanying drawings, which are not necessarily drawn to scale, are incorporated into and constitute a portion of this disclosure, illustrate various implementations and aspects of the disclosed technology, and, together with the description, serve to explain the principles of the disclosed technology. In the drawings.

DETAILED DESCRIPTION

Some implementations of the disclosed technology will be described more fully with reference to the accompanying drawings. This disclosed technology can be embodied in many different forms, however, and should not be construed as limited to the implementations set forth herein. The components described hereinafter as making up various elements of the disclosed technology are intended to be illustrative and not restrictive. Many suitable components that would perform the same or similar functions as components described herein are intended to be embraced within the scope of the disclosed electronic devices and methods. Such other components not described herein can include, but are not limited to, for example, components developed after development of the disclosed technology.

It is also to be understood that the mention of one or more method steps does not imply that the methods steps must be performed in a particular order or preclude the presence of additional method steps or intervening method steps between the steps expressly identified.

Reference will now be made in detail to exemplary embodiments of the disclosed technology, examples of which are illustrated in the accompanying drawings and disclosed herein. Wherever convenient, the same references numbers will be used throughout the drawings to refer to the same or like parts.

Figure 1A:
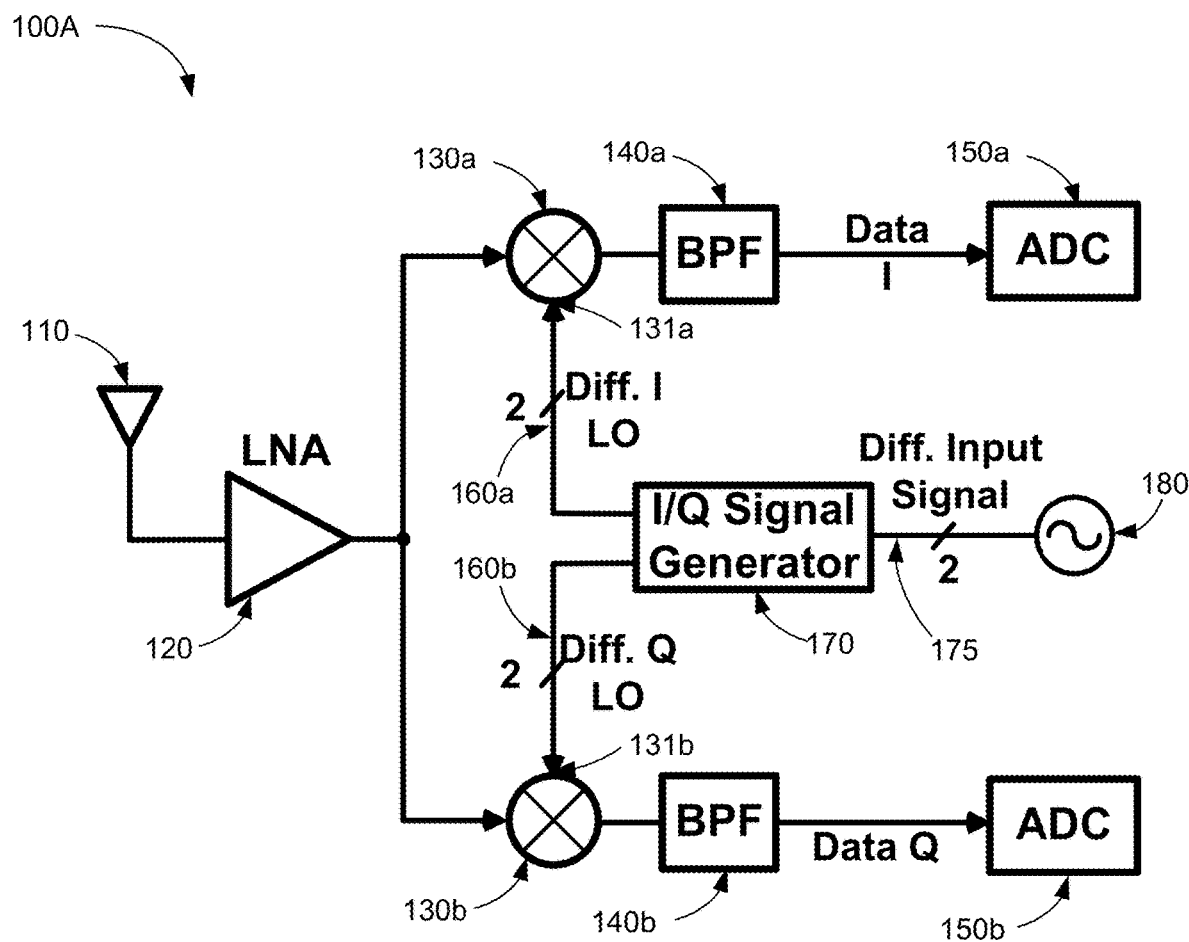
FIG. 1A is a schematic of a receiver frontend block diagram, in accordance with some examples of the present disclosure.

FIG. 1A illustrates the block diagram of an example receiver frontend 100A. The receiver frontend 100A may include a receive path for receiving radio frequency (RF) and millimeter-wave signals from an antenna 110. The received signal from the antenna 110 may be amplified with a low-noise amplifier (LNA) 120 and passed through two mixers 130*a* and 130*b* for down-conversion. After down-converting the received signals in the mixers 130*a* and 130*b*, the baseband signals may be filtered using bandpass filters (BPF) 140*a* and 140*b* and delivered to analog-to-digital converters (ADCs) 150a and 150b. The mixer 130a may multiply the output signal of the LNA 120 with differential in-phase (I) local oscillator (LO) signals 160a. Similarly, the mixer 130b may multiply the output signal of the LNA 120 with differential quadrature (Q) local oscillator (LO) signals 160b. The differential in-phase LO signals 160a may have the same amplitude as the differential quadrature LO signals 160b, but the differential in-phase signals may have a phase shift of ninety degrees relative to the differential quadrature LO signals. This differential I and Q signals 160a and 160b may be generated with an I/Q signal generation system 170. The I/Q signal generation system 170 may have one differential input 175 to receive continuous wave sinusoidal signals from a frequency synthesizer 180. The I/Q signal generation system outputs will deliver in-phase and quadrature signals (160a and 160b) to the LO ports (131a and 131b) of the mixer 130a and 130b, respectively. The mixers 130a and 130b may include switching transistors to chop the received RF signal with LO signals to perform frequency conversion. Then, LO ports 131a and 131b of the mixer may be connected to the switching transistors 132a and 132b inside the mixer.

Figure 1B:
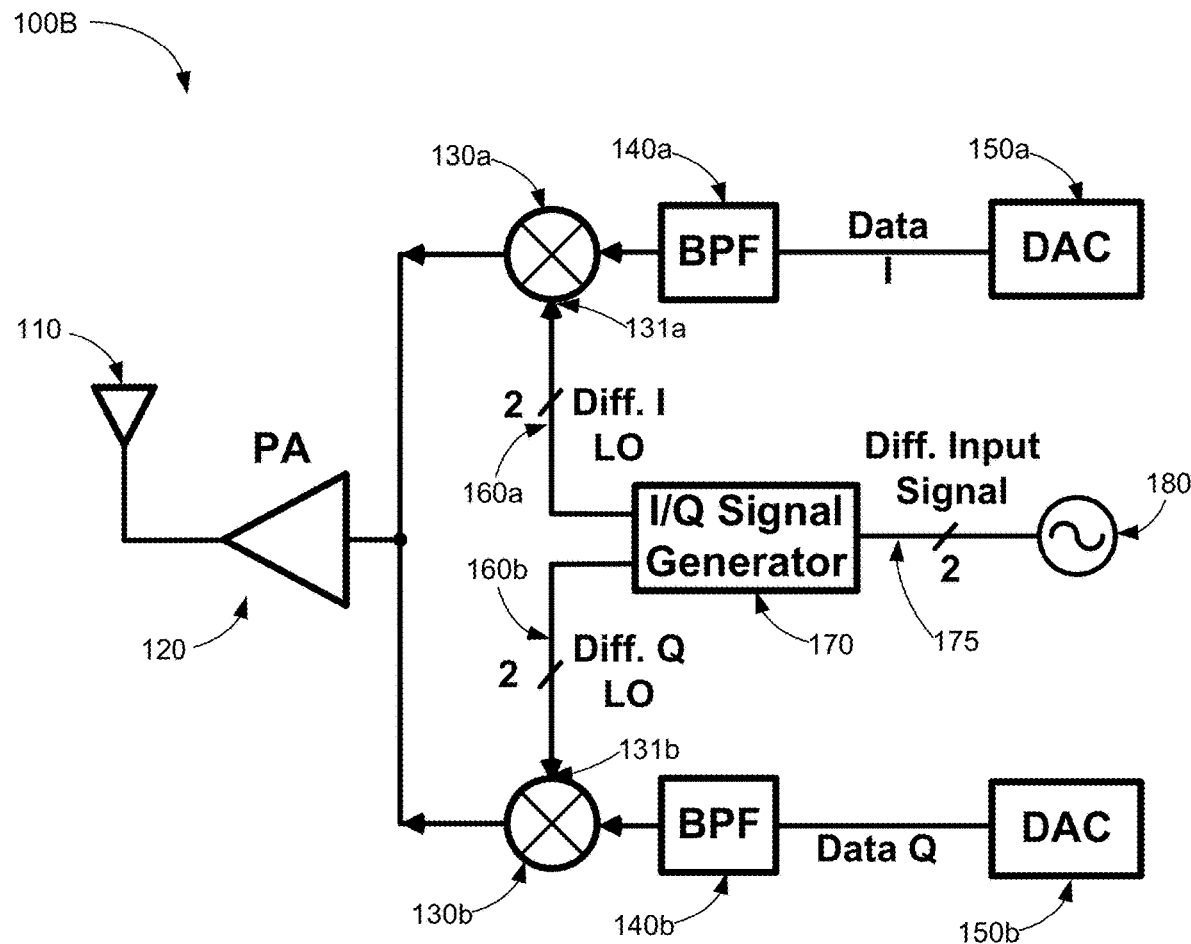
FIG. 1B is a schematic of a transmitter frontend block diagram, in accordance with some examples of the present disclosure.

FIG. 1B illustrates the block diagram of an example transmitter frontend 100B. The transmitter frontend 100B may include a transmit path for receiving radio frequency (RF) and millimeter-wave signals from an antenna 110. T base-band signals may be generated with digital-to-analog converters (DACs) 150a and 150b. These base-band signals may be filtered using bandpass filters (BPF) 140a and 140b and passed through two mixers 130a and 130b for up-conversion. The Up-converted signal may be amplified with a power amplifier (PA) 120 and delivered to the antenna 110. The mixer 130a may multiply the output signal of the BPF 140 with differential in-phase (I) local oscillator (LO) signals 160a. Similarly, the mixer 130b may multiply the output signal of the BPF 140 with differential quadrature (Q) local oscillator (LO) signals 160b. The differential in-phase LO signals 160a may have the same amplitude as the differential quadrature LO signals 160b, but the differential in-phase signals may have a phase shift of ninety degrees relative to the differential quadrature LO signals. The differential I and Q signals 160a and 160b may be generated with an I/Q signal generation system 170. The I/Q signal generation system 170 may have one differential input 175 to receive continuous wave sinusoidal signals from a frequency synthesizer 180. The I/Q signal generation system outputs may deliver in-phase and quadrature signals, 160a and 160b, to the LO ports 131a and 131b of the mixer 130a and 130b, respectively. The mixers 130a and 130b may include switching transistors to chop the received RF signal with LO signals to perform frequency conversion. Then, LO ports 131a and 131b of the mixer may be connected to the switching transistors 132a and 132b inside the mixer.

Figure 2A:
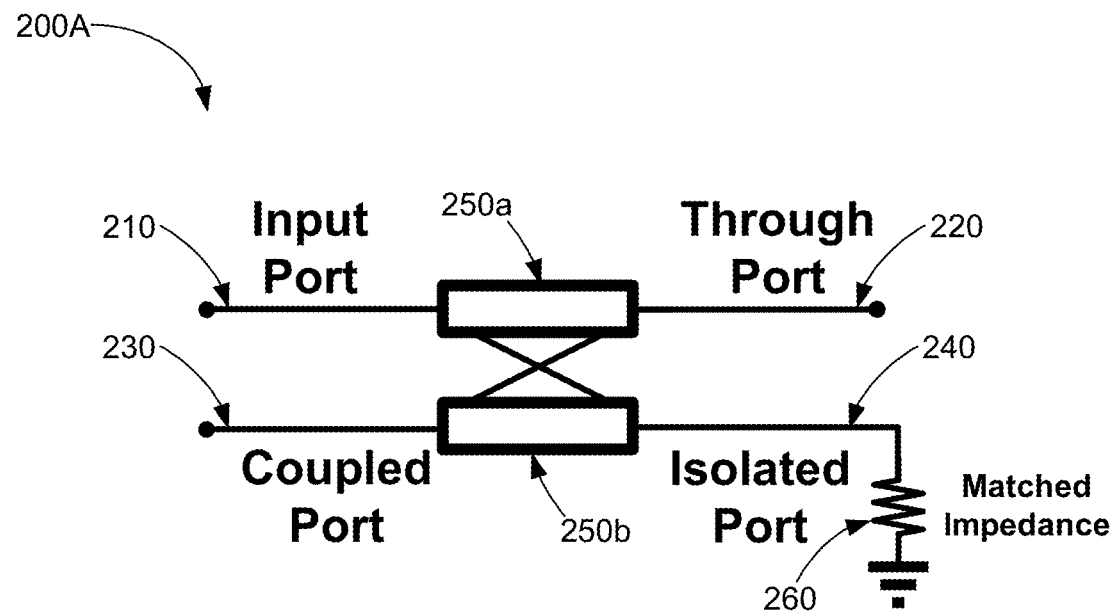
FIG. 2A is an image of a coupled-line coupler with port names, where an isolation port of the coupled-line coupler is terminated in a matched impedance, in accordance with some examples of the present disclosure.

FIG. 2A illustrates the schematic of a coupled-line coupler 200A which may be conventionally used to generate in-phase and quadrature signals. The coupled-line coupler 200A may have an input port 210, a through port 220, a coupled port 230, and an isolation port 240. The coupled-line coupler may consist of a pair of transmission lines 250a and 250b. When a signal is applied to the input port 210 of the coupled-line coupler, the coupled-line coupler may deliver a fraction of the input signal to the through port 220 and the rest of the input signal to the coupled port 230. Ideally, no power is delivered to the isolation port 240. However, this port may be terminated in a matched impedance 260 (e.g., a resistor) to minimize the reflections.

Figure 2B:
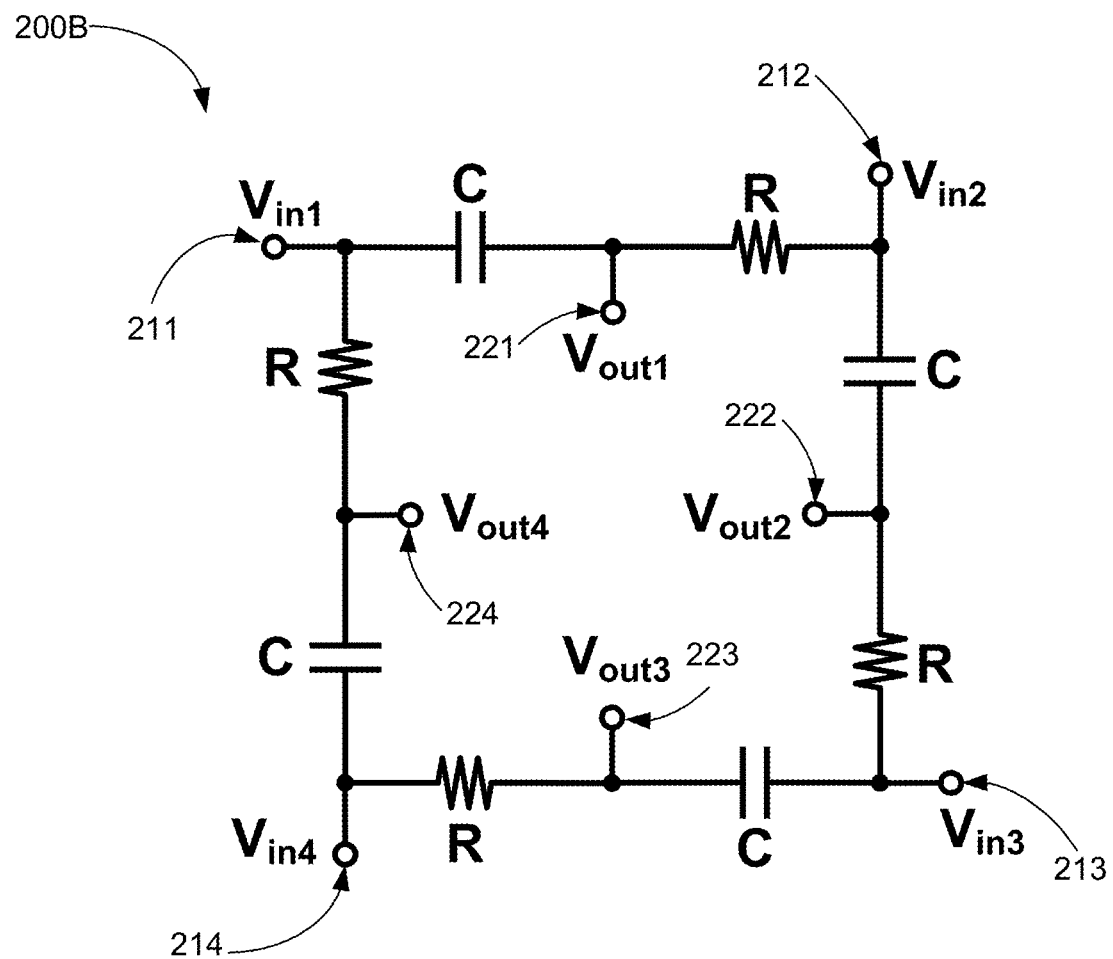
FIG. 2B is an image of a resistor-capacitor polyphase filter, in accordance with some examples of the present disclosure.

FIG. 2B illustrates the schematic of an example resistor-capacitor (RC) polyphase filter (PPF) 200B which may be conventionally used for in-phase and quadrature signal generation. The RC PPF 200B may have four inputs 211, 212, 213, and 214, and it may have four outputs 221, 222, 223, and 224. The operation of a RC PPF is explained in detail in a paper by Behbahani, F. and Kishigami, Y. and Leete, J. and Abidi, A. A., titled, "CMOS Mixers and Polyphase Filters for Large Image Rejection," published in the IEEE Journal of Solid-State Circuits, vol. 36, no. 6, pp. 873-887, June 2001. Several stages of RC PPFs 200B may be cascaded to generate broadband I/Q signals, which may occur at the expense of high insertion loss. At millimeter-wave frequencies, the interconnects of the RC PPF 200B may introduce phase shift and may degrade the performance of the PPF. The effects of the interconnects are analyzed in detail by M. Frounchi and J. D. Cressler, entitled "Dual-Band Millimeter-Wave Quadrature LO Generation with a Common-Centroid Floorplan," published in IEEE Transactions on Circuits and Systems II: Express Briefs.

Figure 3A:
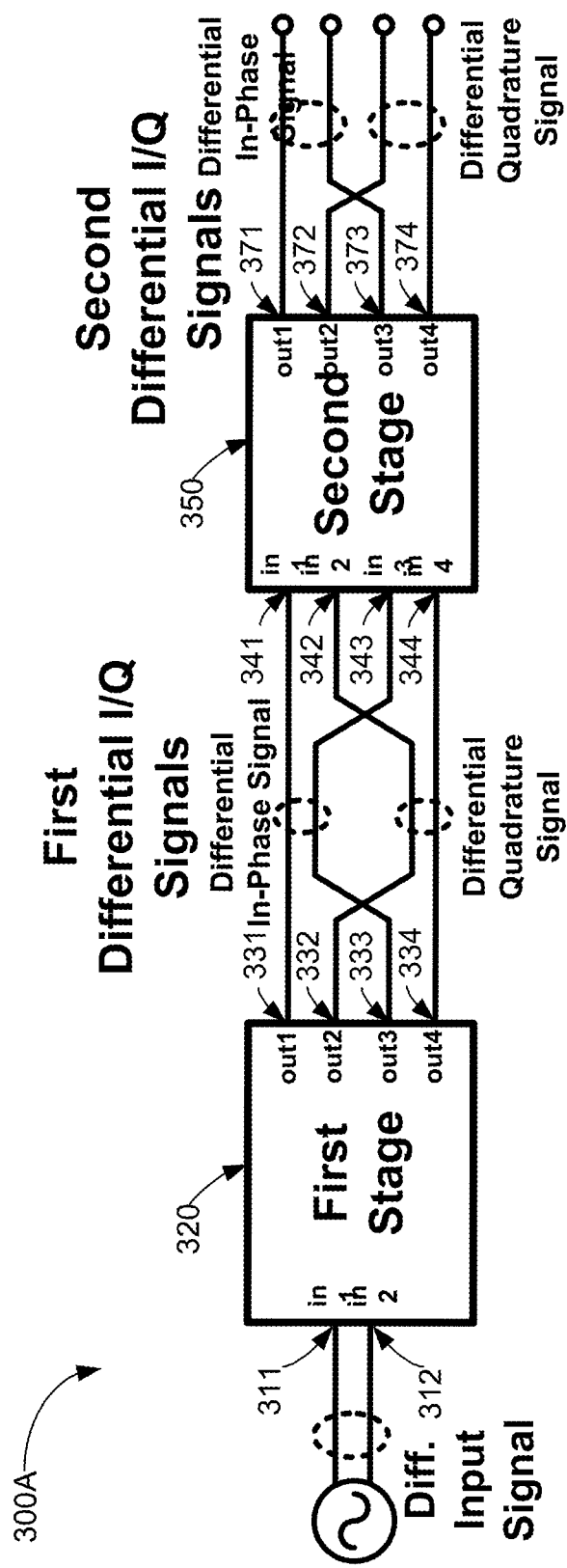
FIG. 3A is an image of a two-stage I/Q signal generation system, in accordance with some examples of the present disclosure.

FIG. 3A shows a block diagram 300A of an I/Q signal generation system 170, such as the one shown in FIGS. 1A-B, having two stages. The first stage 320 may receive a differential input signal, which may include a first input signal and a second input signal. Further, the second input signal 312 may have a phase shift of one-hundred-eighty degrees relative to the first input signal. The first stage may also include a first input 311 that may receive the first input signal. Also, the first stage may include a second input 312 that may receive the second input signal. The first stage may then generate first differential I/Q output signals, which may include a first output signal, a second output signal, a third output signal, and a fourth output signal. The output signals may be based on the input differential signal and the output signals may have the following phase shifts: the second output signal may have a phase shift of ninety degrees relative to the first output signal; the third output signal may have a phase shift of ninety degrees relative to the second output signal; and the fourth output signal may have a phase shift of ninety degrees relative to the third output signal. The first stage may also include a first output 331, a second output 332, a third output 333, and a fourth output 334. The first output 331, the second output 332, the third output 333, and the fourth output 334 may send the first output signal, the second output signal, the third output signal, and the fourth output signal, respectively. The first output signal, second output signal, third output signal, and fourth output signal may have equal amplitudes and frequencies. Each of the output signals (first, second, third, and fourth output signal) may be sent to the second stage 350 as the first differential I/Q output signals.

The second stage 350 of the I/Q signal generation system 300A may receive the first differential I/Q signals, which may include a first output signal, a second output signal, a third output signal, and a fourth output signal. Further, the output signals may have the following phase shifts: the second output signal may have a phase shift of ninety degrees relative to the first output signal; the third output signal may have a phase shift of ninety degrees relative to the second output signal; and the fourth output signal may have a phase shift of ninety degrees relative to the third output signal. The second stage may also include a first input 341 that may receive the first input signal, a second input 342 that may receive the second input signal, a third input 343 that may receive the third input signal, and a fourth input 344 that may receive the fourth input signal. The second stage may then generate second differential I/Q output signals, which may include a first output signal, a second output signal, a third output signal, and a fourth output signal. The second differential I/Q output signals may be based on the first differential I/Q signals and they may have the following phase shifts: the second output signal may have a phase shift of ninety degrees relative to the first output signal; the third output signal may have a phase shift of ninety degrees relative to the second output signal; and the fourth output signal may have a phase shift of ninety degrees relative to the third output signal. The second stage may also include a first output 371, a second output 372, a third output 373, and a fourth output 374. The first output 371, the second output 372, the third output 373, and the fourth output 374 may send the first output signal, the second output signal, the third output signal, and the fourth output signal, respectively. The first output signal, second output signal, third output signal, and fourth output signal may have equal amplitudes and frequencies. The amplitude and phase mismatches of the second differential I/Q output signal may be less than the amplitude and phase mismatches of the first differential I/Q output signal.

Figure 3B:
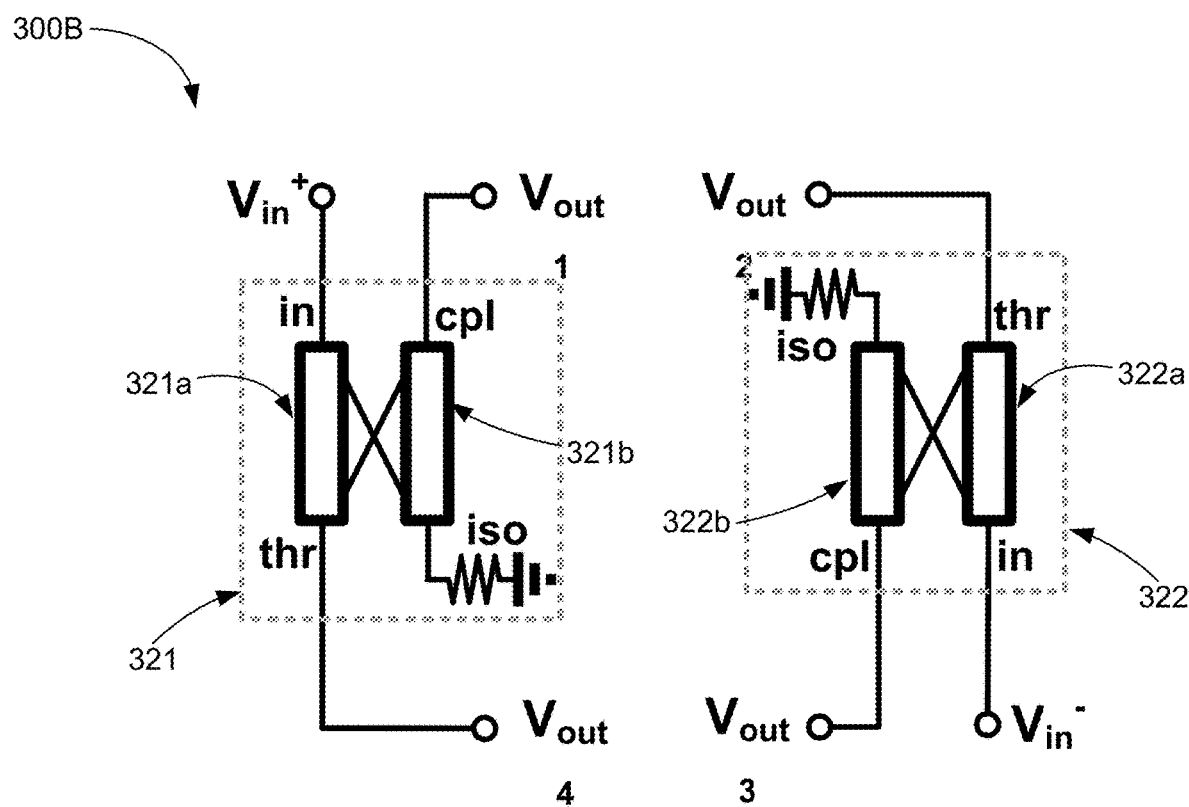
FIG. 3B is an image of the first stage of FIG. 3A showing two coupled-line couplers, where isolation ports of the two coupled-line couplers are terminated in matched impedances, in accordance with some examples of the present disclosure.

FIG. 3B shows an image of the first stage 320 of the I/Q signal generation network 300A. The first stage may include a first coupled-line coupler 321 and a second coupled-line coupler 322. The first coupled-line coupler 321 may include a pair of transmission lines 321a and 321b. Similarly, the second coupled-line coupler 322 may include a pair of transmission lines 322a and 322b. The input ports of the coupled-line couplers (321 and 322) may be connected to the inputs 311 and 312; the through ports of the coupled-line couplers (321 and 322) may be connected to outputs 332 and 334; the coupled ports of the coupled-line couplers (321 and 322) may be connected to outputs 331 and 333; and the isolated ports of the coupled-line couplers (321 and 322) may be terminated in matched impedances.

Figure 3C:
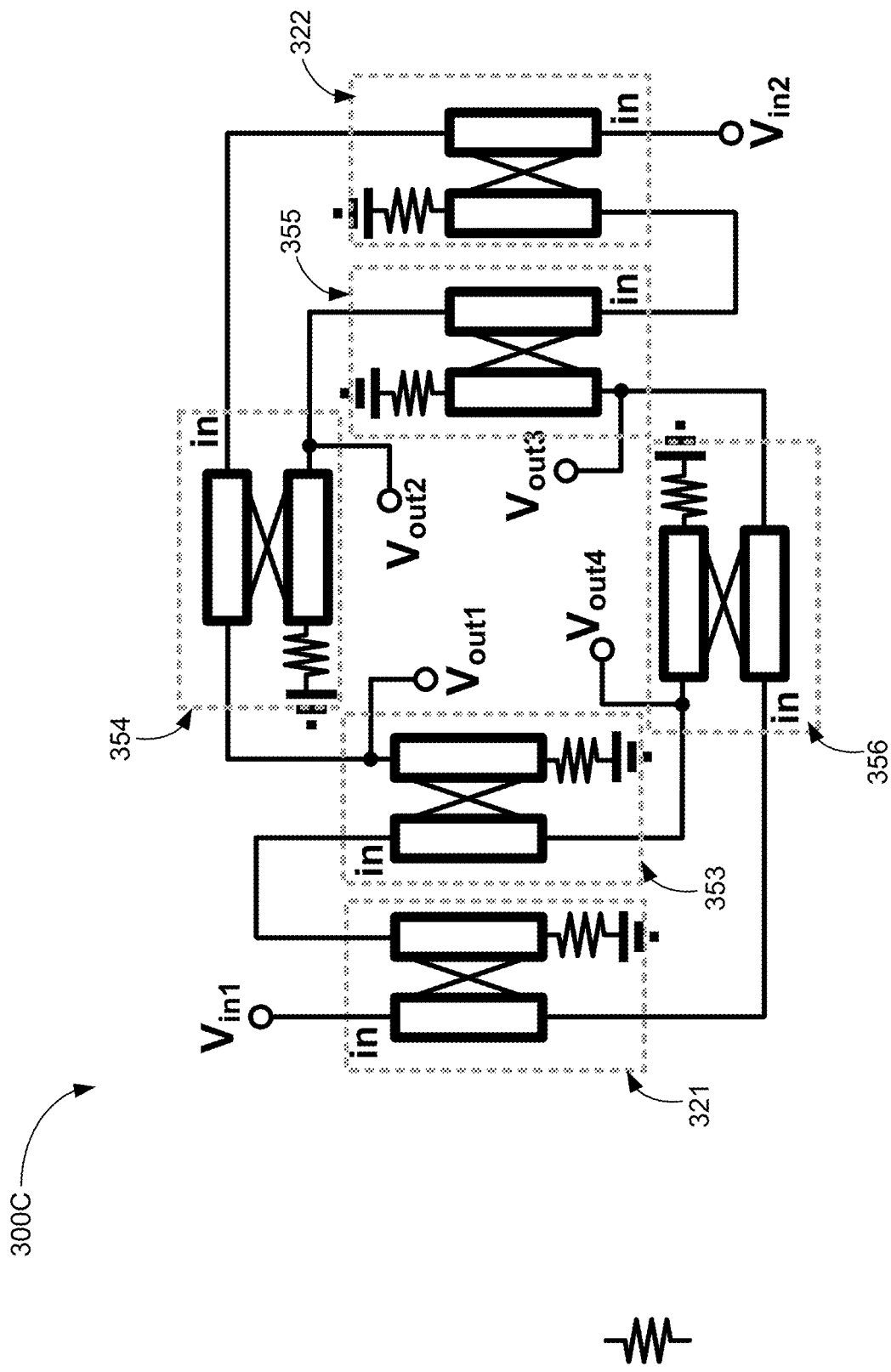
FIG. 3C is an image of a I/Q signal generation system having two coupled-line couplers in a first stage and four coupled-line couplers in a second stage, where the isolation ports of coupled-line couplers are terminated in matched impedances, in accordance with some examples of the present disclosure.

FIG. 3C illustrates both stages of an I/Q signal generation system 300C. The first stage may include a first coupled-line coupler 321 and a second coupled-line coupler 322. The second stage may include a third coupled-line coupler 353, a fourth coupled-line coupler 354, a fifth coupled-line coupler 355, a sixth coupled-line coupler 356. The I/Q signal generation system 300C may provide differential in-phase and quadrature signals at millimeter-wave frequencies that may eliminate the need for calibration and tuning, and further may help achieve multi-Gb/s data rates. Also, the quadrature signal generation system 300C may have a zero power consumption, such that it does not require a feedback system. Additionally, the I/Q signal generation system 300C may be scalable based at least in part on the length of the coupled-line couplers (e.g., 321, 322, 353, 354, 355, and 356). The design of the I/Q signal generation system 300C may allow for platform-independence, which may allow it to be implemented in various integrated circuits technology platform. Other advantages of the I/Q signal generation system 300C may include reduced sensitivity to the fabrication process, passive and linear operations, a small footprint and/or a lower fabrication cost.

In the second stage of I/Q signal generation system 300C, a coupled port of the third coupled-line coupler 353 may be connected to a through port of the fourth coupled-line coupler 354, a coupled port of the fourth coupled-line coupler 354 may be connected to a through port of the fifth coupled-line coupler 355, a coupled port of the fifth coupled-line coupler 355 may be connected to a through port of the sixth coupled-line coupler 356, and a coupled port of the sixth coupled-line coupler 356 may be connected to a through port of the third coupled-line coupler 353. The second stage may generate a second differential I/Q output signals. Further, the amplitude and phase mismatches of the second differential I/Q output signals may be less than the amplitude and phase mismatches of the first differential I/Q output signals. Cascading the coupled-line couplers, as depicted in FIG. 3C, may help lessen the amplitude and phase mismatches of the second differential I/Q output signals.

As shown in FIG. 3C, the quadrature signal generation system 300C may have a symmetrical layout, which may reduce the sensitivity of the phase and amplitude matching to loading capacitance. Also, the I/Q signal generation system 300C may provide for an image rejection ratio of between 29 and 50 dB across a frequency range of 42-102 GHz.

Figure 3D:
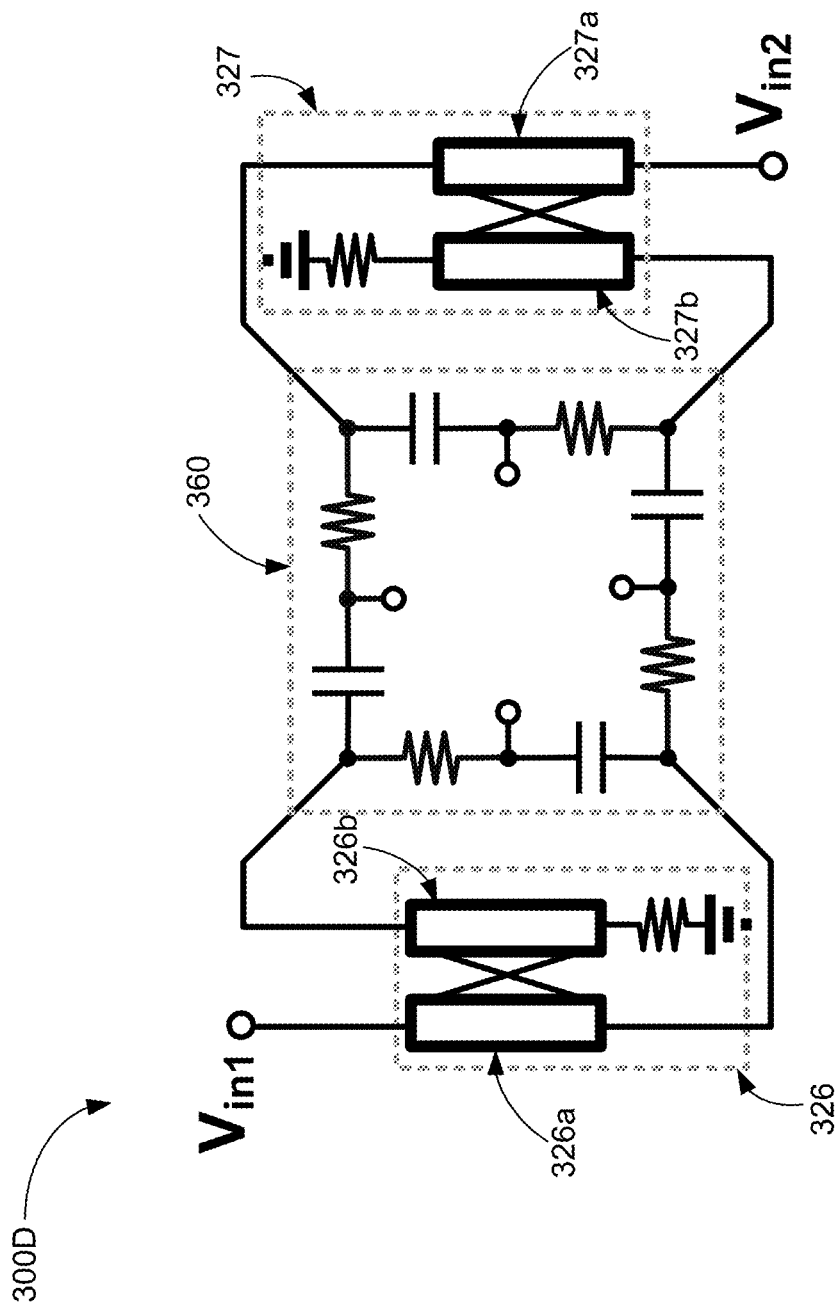
FIG. 3D is an image of another a quadrature signal generation system having two coupled-line couplers in the first stage and a resistor-capacitor (RC) polyphase filter in the second stage, where the isolation port of coupled-line couplers are terminated in matched impedances, in accordance with some examples of the present disclosure.

FIG. 3D depicts a quadrature signal generation system 300D having two coupled-line couplers (first coupled-line coupler 326 (326a and 326b) and second coupled-line coupler 327 (327a and 327b)) in the first stage and a resistor-capacitor (RC) polyphase filter 360 in the second stage. The I/Q signal generation system 300D may have many or all the advantages of the I/Q signal generation system 300C, which may be provided at least in part by a symmetrical layout. Further, the first coupled-line coupler 326 and the second coupled-line coupler 327 may be substantially similar or the same as the first coupled-line coupler 321 and the second coupled-line coupler 322, respectively, of FIG. 3C. Therefore, the first coupled-line coupler 326 may include a pair of transmission lines 326a and 326b. Similarly, the second coupled-line coupler 327 may include a pair of transmission lines 327a and 327b. The first stage may include a first input 311 and a second input 312, which may receive a first input signal and second input signal, respectively. Together, the first input signal and the second input signal may comprise the differential input signal. As mentioned above, the second input signal may have a phase shift of one hundred and eighty degrees relative to the first input signal. Also, similar to the first stage described in FIG. 3B, the first stage may generate and send the first differential I/Q output signals (the first output signal, the second output signal, the third output signal, and the fourth output signal) to the second stage, which may have the phase shifts according to the requirements set forth in FIG. 3C.

The second stage (e.g., RC polyphase filter 360) may receive the first differential I/Q output signals from the first stage and generate a second differential I/Q output signals that has amplitude and phase mismatches less than the first differential I/Q output signals. The second stage may have four outputs; first output 371, second output 372, third output 373, and fourth output 374, which may send the first output signal, the second output signal, the third output signal, and the fourth output signal, respectively. Of course, the first, second, third, and fourth output signals may have equal amplitudes and frequencies.

Figure 4:
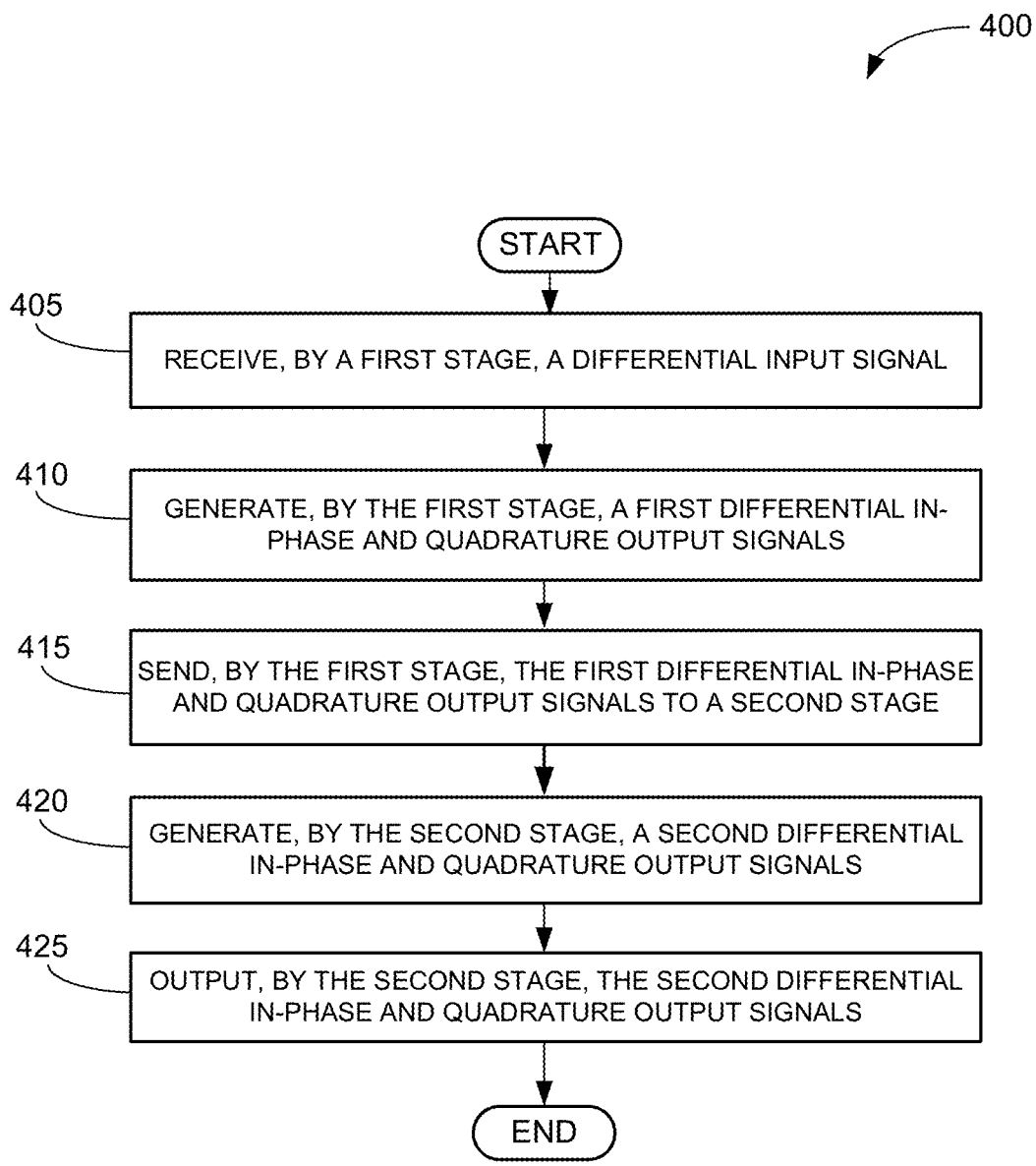
FIG. 4 is a flowchart illustrating a method for quadrature signal generation, in accordance with some examples of the present disclosure.

FIG. 4 illustrates an example flow chart of a method for I/Q signal generation. The method 400 can be implemented by the quadrature generation system 300C and the I/Q generation system 300D. At 405, the first stage (e.g., coupled-line coupler 321 and 322, or coupled-line couplers 326 and 327) may receive a differential input signal. As mentioned above, the differential input signal may include a first input signal and a second input signal, which may be received at a first input (e.g., 311) and second input (e.g., 312), respectively. Further, the second input signal may have a phase shift of one hundred eighty degrees relative to the first input signal. At 410, the first stage may generate a first differential I/Q output signals based on the differential input signal. The first differential I/Q output signals may have four output signals (first, second, third, and fourth output signal). At 415, the first differential output signal may be sent from the first stage and to the second stage, i.e., each of the four outputs (e.g., 331, 332, 333, and 334) of the first stage sends an output signal to the second stage. The second stage may be the RC polyphase filter 360 or the four coupled-line couplers (353, 353, 355, and 356). At 420, the second stage may generate a second differential I/Q output signals, which may have a reduced amplitude and phase mismatches compared to the first differential I/Q signals. At, 425, the second stage may output the second differential I/Q output signals.

Figure 5A:
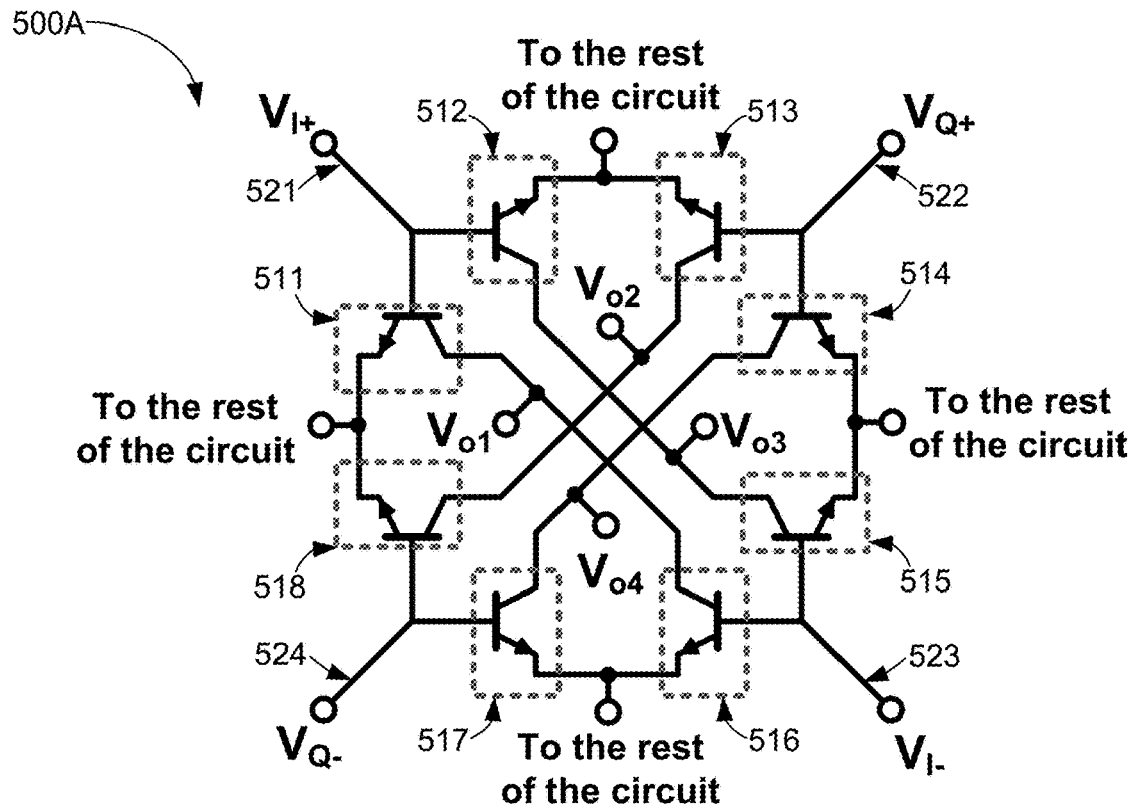
FIG. 5A is a schematic of the switching transistors of a Gilbert mixer to which an I/Q signal generation system outputs may be connected, in accordance with some examples of the present disclosure.

FIG. 5A shows the schematic 500A of an exemplary mixer (130a and 130b), which may be implemented with double-balanced topology and may include eight switching transistors 511,512, 513, 514, 515, 516, 517, and 518 with four I/Q local oscillator (LO) inputs (e.g., 160a and 160b in FIG. 1). The first I/Q LO input 521 may be connected to the Base of switching transistors 511 and 512; the second I/Q LO input 522 may be connected to the Base of switching transistors 513 and 514; the third I/Q LO input 523 may be connected to the Base of switching transistors 515 and 516; and the fourth I/Q LO input 524 may be connected to the Base of switching transistors 517 and 518.

Figure 5B:
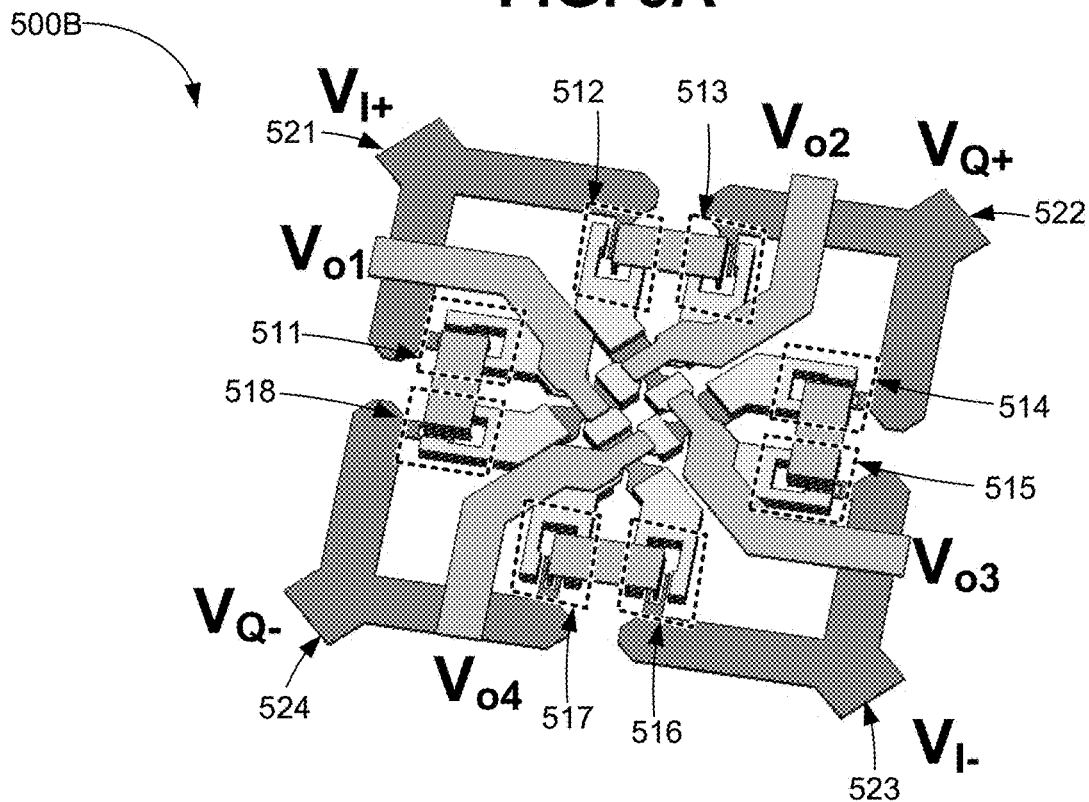
FIG. 5B is an image of a floorplan and interconnects of switching transistors of a Gilbert mixer to which the I/Q signal generation system outputs may be connected, in accordance with some examples of the present disclosure.

FIG. 5B shows a common-centroid symmetric floorplan 500B of the eight switching transistors 511,512, 513, 514, 515, 516, 517, and 518 with all interconnects. The first I/Q LO input 521 may be connected to the Base of switching transistors 511 and 512; the second I/Q LO input 522 may be connected to the Base of switching transistors 513 and 514; the third I/Q LO input 523 may be connected to the Base of switching transistors 515 and 516; and the fourth I/Q LO input 524 may be connected to the Base of switching transistors 517 and 518.

Figure 6A:
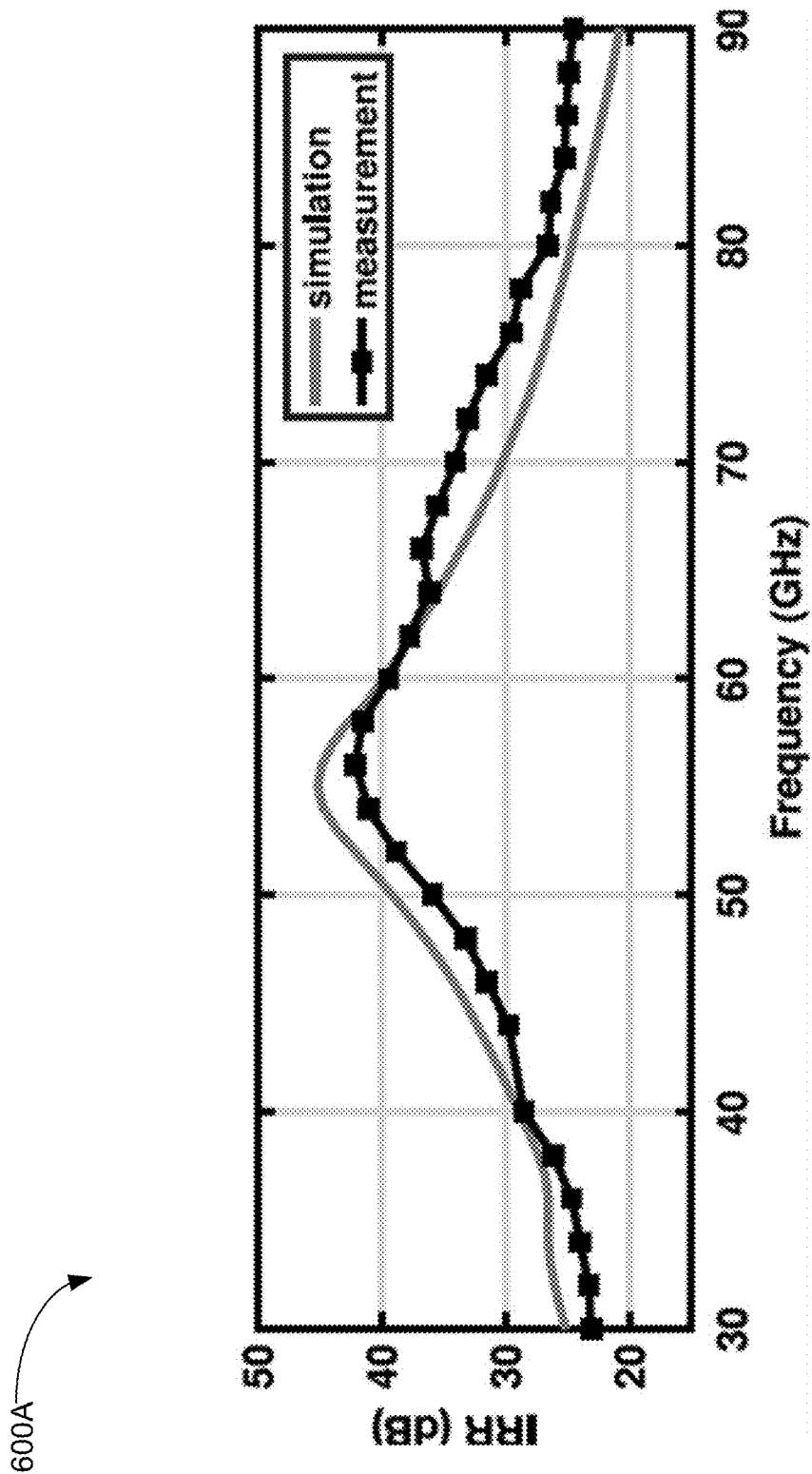
FIGS. 6A-C are graphs illustrating the image rejection ratios for various I/Q signal generation systems, in accordance with some examples of the present disclosure.
Figure 6B:
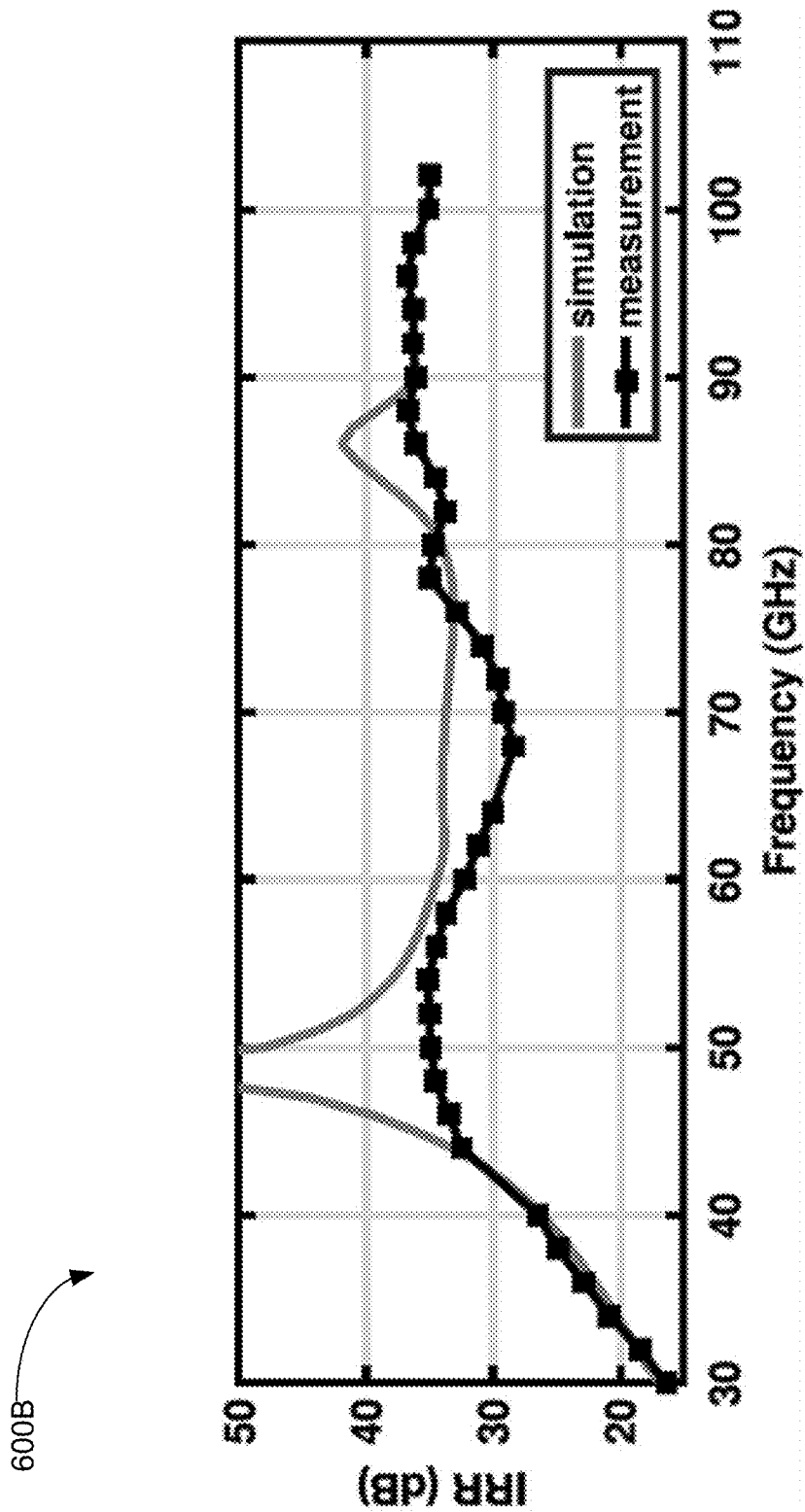
Figure 6C:
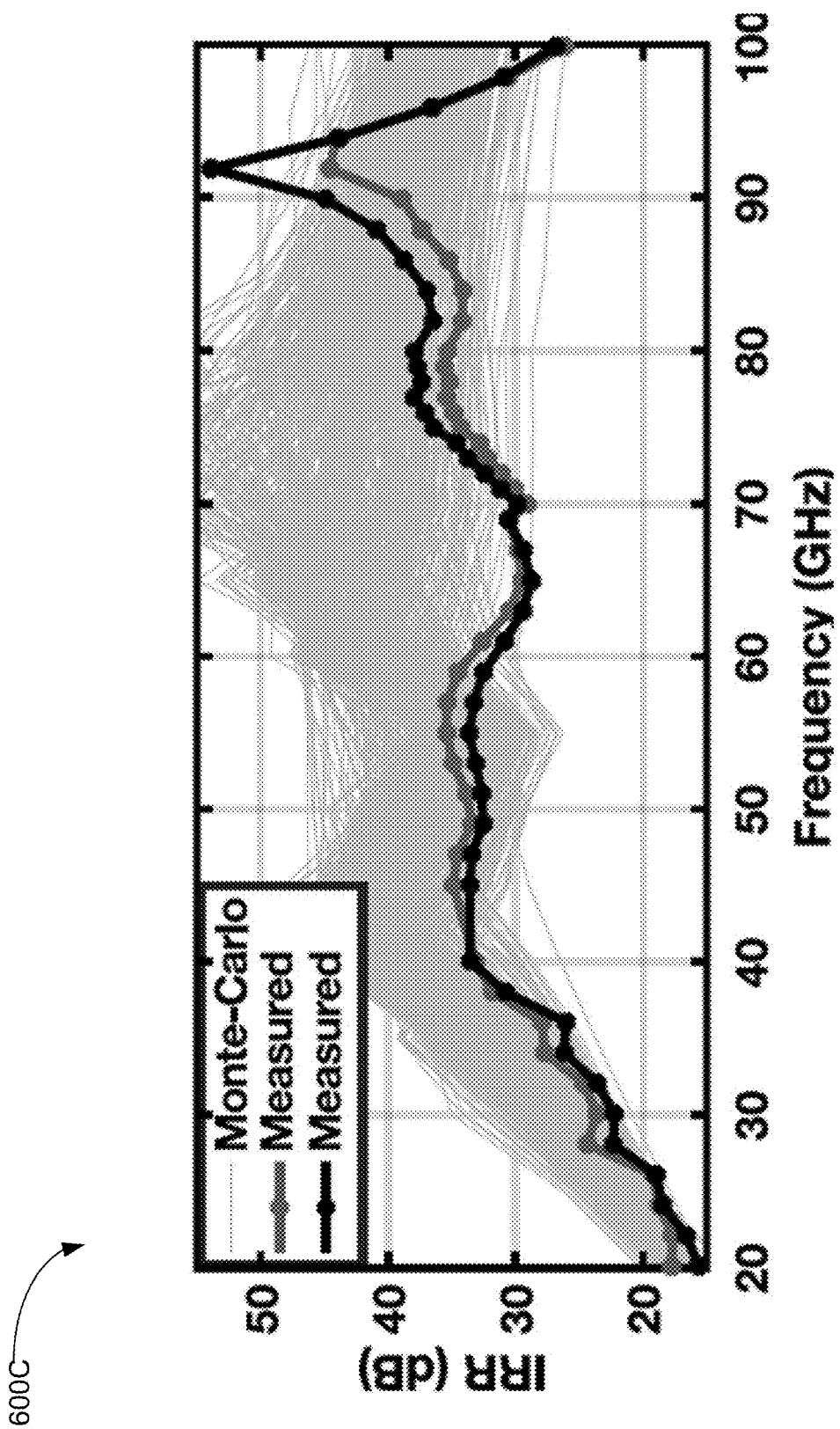

FIGS. 6A-C show the image rejection ratios of various mixers (e.g., 130a and 130b in FIG. 1) where the differential I/Q signals were generated with systems 300C and 300D. The image rejection ratio of mixers may be a direct function of the phase and amplitude matching of the quadrature signals and it is calculated by $$IRR = \frac{1 + 2\alpha\cos(\theta) + \alpha^2}{1 - 2\alpha\cos(\theta) + \alpha^2}$$

Where α is the amplitude error, and θ is the phase error.

Throughout the specification and the claims, the following terms take at least the meanings explicitly associated herein, unless the context clearly dictates otherwise. The term "or" is intended to mean an inclusive "or." Further, the terms "a," "an," and "the" are intended to mean one or more unless specified otherwise or clear from the context to be directed to a singular form.

In this description, numerous specific details have been set forth. It is to be understood, however, that implementations of the disclosed technology can be practiced without these specific details. In other instances, well-known methods, structures and techniques have not been shown in detail in order not to obscure an understanding of this description. References to "one embodiment," "an embodiment," "some embodiments," "example embodiment," "various embodiments," "one implementation," "an implementation," "example implementation," "various implementations," "some implementations," etc., indicate that the implementation(s) of the disclosed technology so described can include a particular feature, structure, or characteristic, but not every implementation necessarily includes the particular feature, structure, or characteristic. Further, repeated use of the phrase "in one implementation" does not necessarily refer to the same implementation, although it can.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

While certain implementations of the disclosed technology have been described in connection with what is presently considered to be the most practical and various implementations, it is to be understood that the disclosed technology is not to be limited to the disclosed implementations, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain implementations of the disclosed technology, including the best mode, and also to enable any person skilled in the art to practice certain implementations of the disclosed technology, including making and using any devices or systems and performing any incorporated methods. The patentable scope of certain implementations of the disclosed technology is defined in the claims, and can include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An in-phase and quadrature signal generation system comprising:
    a first stage configured to:
        receive a first set of differential input signals; and
        generate a first set of differential in-phase/quadrature (I/Q) output signals; and
    a second stage configured to:
        receive the first set of differential I/Q output signals; and
        generate a second set of differential I/Q output signals;
    wherein the amplitude and phase mismatches between the second set of differential I/Q output signals is less than the amplitude and phase mismatches between the first set of differential I/Q output signals, compensating for quadrature errors of the first set of differential I/Q output signals;
    wherein the first stage comprises:
        a first coupled line coupler (CLC); and
        a second CLC;
        wherein each CLC comprises:
            a pair of transmission lines close enough in proximity so when energized, energy from one of the transmission lines passes to the other transmission line;
            an inlet port directly coupled to a through port across one of the pair of transmission lines;
            a coupled port coupled to the inlet port; and
            an isolation port directly connected to the coupled port across transmission line;
            wherein the isolation port is terminated to an optimum impedance; and wherein the signal generation system is configured to:
  generate the second set of differential I/Q output signals at mm-wave frequencies; and
  achieve an image rejection ratio of more than 29 across a frequency range of between 42-102 GHz.

2. The system of claim 1, wherein the first stage is further configured to maintain the frequency of the second set of differential output signals the same as the frequency of the first set of differential I/Q input signals;
  wherein the first set of differential input signals comprises a first input signal and a second input signal; and
  wherein the first input signal has a phase shift relative to the second input signal.

3. The system of claim 2, wherein the first input signal of the first set of differential input signals has a phase shift of or about 180 degrees relative to the second input signal; and
  wherein the second set of differential I/Q output signals comprise:
    a first output signal having a phase shift of or about ninety degrees relative to a second output signal;
    the second output signal having a phase shift of or about ninety degrees relative to a third output signal;
    the third output signal having a phase shift of or about ninety degrees relative to a fourth output signal; and
    the fourth output signal having a phase shift of or about ninety degrees relative to the first output signal.

4. The system of claim 1, wherein the second stage comprises a resistor-capacitor (RC) polyphase filter.

5. The system of claim 4, wherein a physical implementation of the RC polyphase filter has a symmetrical layout with respect to a center of the polyphase filter.

6. An in-phase and quadrature signal generation system comprising:
  a first stage configured to:
    receive a first set of differential input signals, wherein the first set of differential input signals comprises a first input signal having a phase shift of or about 180 degrees relative to a second input signal; and
    generate a first set of differential in-phase/quadrature (I/Q) output signals; and
  a second stage configured to:
    receive the first set of differential I/Q output signals; and
    generate a second set of differential I/Q output signals comprising:
      a first output signal having a phase shift of or about ninety degrees relative to a second output signal;
      the second output signal having a phase shift of or about ninety degrees relative to a third output signal;
      the third output signal having a phase shift of or about ninety degrees relative to a fourth output signal; and
      the fourth output signal having a phase shift of or about ninety degrees relative to the first output signal
    wherein the first stage is further configured to maintain the frequency of the second set of differential I/Q output signals the same as the frequency of the first set of differential I/Q input signals;
    wherein the amplitude and phase mismatches between the second set of differential I/Q output signals is less than the amplitude and phase mismatches between the first set of differential I/Q output signals, compensating for quadrature errors of the first set of differential I/Q output signals;
    wherein the second stage comprises:
      a first coupled line coupler (CLC);
      a second CLC;
      a third CLC; and
      a fourth CLC;
      wherein each CLC comprises:
        a pair of transmission lines close enough in proximity so when energized, energy from one of the transmission lines passes to the other transmission line;
        an inlet port directly coupled to a through port across one of the pair of transmission lines;
        a coupled port coupled to the inlet port; and
        an isolation port directly connected to the coupled port across transmission line;
        wherein the isolation port is terminated to an optimum impedance; and
    wherein the signal generation system is configured to:
      generate the second set of differential I/Q output signals at mm-wave frequencies; and
      achieve an image rejection ratio of more than 29 across a frequency range of between 42-102 GHz.

7. The system of claim 6, wherein:
the coupled port of the second CLC is connected to the through port of the first CLC;
the coupled port of the third CLC is connected to the through port of the second CLC;
the coupled port of the fourth CLC is connected to the through port of the third CLC; and
the coupled port of the first CLC is connected to the through port of the fourth CLC.

8. A receiver comprising:
an antenna configured to receive signals;
an amplifier configured to receive signals from the antenna;
an in-phase down-conversion path comprising:
  a first mixer;
  a first filter; and
  a first baseband unit;
a quadrature down-conversion path comprising:
  a second mixer;
  a second filter; and
  a second baseband unit; and
an in-phase and quadrature (I/Q) signal generation path comprising:
  a synthesizer; and
  the signal generation system of claim 6;
  wherein the signal generation system is configured to generate:
    differential in-phase (I) local oscillator (LO) signals (ILO signals); and
    differential quadrature (Q) local oscillator (LO) signals (QLO signals).

9. A transmitter comprising:
an antenna configured to transmit signals;
an amplifier configured to send signals to the antenna;
an in-phase up-conversion path comprising:
  a first mixer;
  a first filter; and
  a first baseband unit;
a quadrature up-conversion path comprising:
  a second mixer;
  a second filter; and
  a second baseband unit; and
an in-phase and quadrature (I/Q) signal generation path comprising:
  a synthesizer; and
  the signal generation system of claim 6;

wherein the signal generation system is configured to generate:
differential in-phase (I) local oscillator (LO) signals (ILO signals); and
differential quadrature (Q) local oscillator (LO) signals (QLO signals).

10. An in-phase and quadrature signal generation system comprising:
a first stage configured to:
receive a first set of differential input signals; and
generate a first set of differential in-phase/quadrature (I/Q) output signals; and
a second stage configured to:
receive the first set of differential I/Q output signals; and
generate a second set of differential I/Q output signals;
wherein the amplitude and phase mismatches between the second set of differential I/Q output signals is less than the amplitude and phase mismatches between the first set of differential I/Q output signals, compensating for quadrature errors of the first set of differential I/Q output signals; and
wherein the first stage comprises:
a first coupled line coupler (CLC); and
a second CLC;
wherein each CLC comprises:
a pair of transmission lines close enough in proximity so when energized, energy from one of the transmission lines passes to the other transmission line;
an inlet port directly coupled to a through port across one of the pair of transmission lines;
a coupled port coupled to the inlet port; and
an isolation port directly connected to the coupled port across transmission line;
wherein the isolation port is terminated to an optimum impedance.

11. The system of claim 10, wherein the second stage comprises a resistor-capacitor (RC) polyphase filter.

12. The system of claim 11, wherein the signal generation system is configured to:
generate the second set of differential I/Q output signals at mm-wave frequencies; and
achieve an image rejection ratio of more than 29 across a frequency range of between 36-98 GHz.

13. The system of claim 10, wherein each CLC is selected from the group consisting of an edge-coupler, a broadside-coupler, and a Lange-coupler.

14. The system of claim 10, wherein a physical implementation of the first and second CLC has a symmetrical layout with respect to a center of the first stage.

15. The system of claim 10, wherein the second stage comprises:
a first CLC;
a second CLC;
a third CLC; and
a fourth CLC;
wherein the coupled port of the second CLC is connected to the through port of the first CLC;
wherein the coupled port of the third CLC is connected to the through port of the second CLC;
wherein the coupled port of the fourth CLC is connected to the through port of the third CLC; and
wherein the coupled port of the first CLC is connected to the through port of the fourth CLC.

16. The system of claim 15, wherein the signal generation system is configured to generate the second set of differential I/Q output signals at mm-wave frequencies;
wherein the first stage is further configured to maintain the frequency of the first set of differential input signals the same as the frequency of the first set of differential I/Q output signals;
wherein the first set of differential input signals comprises a first input signal and a second input signal;
wherein the first input signal has a phase shift of or about 180 degrees relative to the second input signal;
wherein the second set of differential I/Q output signals comprise:
a first output signal having a phase shift of or about ninety degrees relative to a second output signal;
the second output signal having a phase shift of or about ninety degrees relative to a third output signal;
the third output signal having a phase shift of or about ninety degrees relative to a fourth output signal; and
the fourth output signal having a phase shift of or about ninety degrees relative to the first output signal.

17. The system of claim 15, wherein each CLC of the first and second stages is selected from the group consisting of an edge-coupler, a broadside-coupler, and a Lange-coupler.

18. The system of claim 15, wherein a physical implementation of the first and second CLC of the first stage has a symmetrical layout with respect to a center of the first stage; and
wherein a physical implementation of the first, second, third and fourth CLC of the second stage has a symmetrical layout with respect to the center of the first stage.

19. The system of claim 10, wherein the signal generation system is configured to generate the second set of differential I/Q output signals at mm-wave frequencies;
wherein the first stage is further configured to maintain the frequency of the first set of differential input signals the same as the frequency of the first set of differential I/Q output signals;
wherein the first set of differential input signals comprises a first input signal and a second input signal;
wherein the first input signal has a phase shift of or about 180 degrees relative to the second input signal;
wherein the second set of differential I/Q output signals comprise:
a first output signal having a phase shift of or about ninety degrees relative to a second output signal;
the second output signal having a phase shift of or about ninety degrees relative to a third output signal;
the third output signal having a phase shift of or about ninety degrees relative to a fourth output signal; and
the fourth output signal having a phase shift of or about ninety degrees relative to the first output signal.

20. A receiver comprising:
an antenna configured to receive signals;
an amplifier configured to receive signals from the antenna;
an in-phase down-conversion path comprising:
a first mixer;
a first filter; and
a first baseband unit;
a quadrature down-conversion path comprising:
a second mixer;
a second filter; and
a second baseband unit; and
an in-phase and quadrature (I/Q) signal generation path comprising:

a synthesizer; and
the signal generation system of claim 10;
wherein the signal generation system is configured to generate:
differential in-phase (I) local oscillator (LO) signals (ILO signals); and
differential quadrature (Q) local oscillator (LO) signals (QLO signals).

21. A transmitter comprising:
an antenna configured to transmit signals;
an amplifier configured to send signals to the antenna;
an in-phase up-conversion path comprising:
a first mixer;
a first filter; and
a first baseband unit;
a quadrature up-conversion path comprising:
a second mixer;
a second filter; and
a second baseband unit; and
an in-phase and quadrature (I/Q) signal generation path comprising:
a synthesizer; and
the signal generation system of claim 10;
wherein the signal generation system is configured to generate:
differential in-phase (I) local oscillator (LO) signals (ILO signals); and
differential quadrature (Q) local oscillator (LO) signals (QLO signals).

22. A transceiver comprising:
the signal generation system of claim 10; and
a first and second mixer;
wherein each mixer comprises a switching core circuit comprising a set of transistors and interconnects;
wherein each transistor of the set of transistors comprises a base, an emitter and a collector;
wherein each interconnect is selected from the group consisting of a base interconnect, a collector interconnect, and an emitter interconnect;
wherein the switching core circuit is configured to receive a set of amplified signals and a set of differential in-phase and quadrature (I/Q) local oscillator (LO) signals;
wherein the set of differential in-phase and quadrature (I/Q) local oscillator (LO) signals comprise:
a positive in-phase (I+) signal;
a positive quadrature (Q+) signal;
a negative in-phase (I−) signal; and
a negative quadrature (Q−);
wherein the base interconnects of a first transistor and a second transistor of the set of transistors are configured to receive the I+ signal;
wherein the base interconnects of a third transistor and a fourth transistor of the set of transistors are configured to receive the Q+ signal;
wherein the base interconnects of a fifth transistor and a sixth transistor of the set of transistors are configured to receive the I− signal; and
wherein the base interconnects of a seventh transistor and an eighth transistor of the set of transistors are configured to receive the Q− signal;
wherein the emitter interconnect of the second transistor is connected to the emitter interconnect of the third transistor;
wherein the emitter interconnect of the fourth transistor is connected to the emitter interconnect of the fifth transistor;
wherein the emitter interconnect of the sixth transistor is connected to the emitter interconnect of the seventh transistor;
wherein the emitter interconnect of the eighth transistor is connected to the emitter interconnect of the first transistor;
wherein the collector interconnect of the first transistor is connected to the collector interconnect of the sixth transistor;
wherein the collector interconnect of the second transistor is connected to the collector interconnect of the fifth transistor;
wherein the collector interconnect of the third transistor is connected to the collector interconnect of the eighth transistor; and
wherein the collector interconnect of the fourth transistor is connected to the collector interconnect of the seventh transistor.

23. The transceiver of claim 22, wherein a physical implementation of switching core circuit has a symmetric layout with respect to its center.

24. The transceiver of claim 23, wherein the base interconnects have the same length;
wherein the collector interconnects have the same length; and
wherein the emitter interconnects have the same length.

* * * * *